United States Patent
Martin et al.

(10) Patent No.: US 7,697,291 B2
(45) Date of Patent: *Apr. 13, 2010

(54) ACTIVE LIQUID METAL THERMAL SPREADER

(75) Inventors: Yves Martin, Ossining, NY (US); Theodore G. Van Kessel, Millbrook, NY (US)

(73) Assignee: International Business Machines Corporation, Armonk, NY (US)

(*) Notice: Subject to any disclaimer, the term of this patent is extended or adjusted under 35 U.S.C. 154(b) by 176 days.

This patent is subject to a terminal disclaimer.

(21) Appl. No.: 11/751,334

(22) Filed: May 21, 2007

(65) Prior Publication Data

US 2007/0215338 A1 Sep. 20, 2007

Related U.S. Application Data

(63) Continuation of application No. 11/037,441, filed on Jan. 18, 2005, now Pat. No. 7,265,977.

(51) Int. Cl.
*H05K 7/20* (2006.01)

(52) U.S. Cl. .................. 361/699; 361/689; 165/80.4; 165/104.33; 257/714

(58) Field of Classification Search .................. 361/699, 361/707; 257/714; 165/80.4, 104.33
See application file for complete search history.

(56) References Cited

U.S. PATENT DOCUMENTS

| | | | |
|---|---|---|---|
| 3,860,949 A | 1/1975 | Stoeckert et al. | |
| 5,268,812 A | 12/1993 | Conte | |
| 5,316,077 A | 5/1994 | Reichard | |
| 5,323,294 A | 6/1994 | Layton et al. | |
| 5,365,402 A | 11/1994 | Hatada et al. | |
| 5,986,884 A | 11/1999 | Jairazbhoy et al. | |
| 6,016,007 A | 1/2000 | Sanger et al. | |
| 6,055,154 A * | 4/2000 | Azar | 361/688 |
| 6,301,109 B1 | 10/2001 | Chu et al. | |
| 6,483,705 B2 * | 11/2002 | Snyder et al. | 361/709 |
| 6,490,159 B1 | 12/2002 | Goenka et al. | |
| 6,501,654 B2 | 12/2002 | O'Connor et al. | |
| 6,591,625 B1 | 7/2003 | Simon | |
| 6,665,186 B1 | 12/2003 | Calmidi et al. | |
| 7,032,392 B2 | 4/2006 | Koeneman et al. | |
| 7,110,258 B2 | 9/2006 | Ding et al. | |
| 7,126,822 B2 * | 10/2006 | Hu et al. | 361/699 |
| 7,215,547 B2 * | 5/2007 | Chang et al. | 361/701 |
| 2005/0083655 A1 | 4/2005 | Jairazbhoy et al. | |
| 2006/0157225 A1 * | 7/2006 | Martin et al. | 165/80.4 |

OTHER PUBLICATIONS

R.R. Schmidt, B.D. Notohardjono, "High-end Server Low-temperature Cooling", IBM Technical Disclosure Bulletin, Nov. 2002, pp. 739-751.

* cited by examiner

*Primary Examiner*—Boris L Chervinsky

(57) ABSTRACT

The present invention is a method and apparatus for cooling a semiconductor heat source. In one embodiment a thermal spreader is provided and includes a substrate for supporting the semiconductor heat source and a heat sink coupled to the substrate. A channel is disposed between the heat sink and substrate. The channel has at least one wall defined by the heat sink. The surface area of the channel wall defined by the heat sink is about 10 to about 100 times the surface area of a bottom surface of the semiconductor heat source. A coolant, for example liquid metal, circulates within the channel.

22 Claims, 4 Drawing Sheets

ACTIVE LIQUID METAL THERMAL SPREADER

CROSS REFERENCE TO RELATED APPLICATIONS

This application is a continuation of U.S. patent application Ser. No. 11/037,441, filed Jan. 18, 2005, now U.S. Pat. No. 7,265,977, which is herein incorporated by reference in its entirety.

GOVERNMENT RIGHTS IN THIS INVENTION

This invention was made with U.S. government support under contract number H98230-04-C-0920 from the Maryland Procurement Office. The U.S. government has certain rights in this invention.

BACKGROUND

The present invention relates generally to semiconductor devices, e.g., microprocessor and integrated circuits, and relates more particularly to the cooling of integrated circuit (IC) chips. Specifically, the present invention relates to a heat exchanger for chip cooling.

Efficient cooling of IC devices is essential to prevent failure due to excessive heating. As the number of CMOS devices per chip and clock speeds have increased, such efficient cooling has become an even more prominent concern. For example, while the current generation of microprocessors generate heat on the order of 100 W/cm2, the next generation computer microprocessors are expected to reach heat generation levels of 200 W/cm2 or more.

Conventionally, IC chips are cooled by a heat exchange mechanism, or heat sink, having a thermally conductive plate coupled to the chip. The plate typically has a plurality of raised fins extending from one surface of the plate. The fins increase the surface area over which air may flow, thereby increasing the rate of heat transfer from the heat sink to the surrounding air.

Such air-cooled methods have generally proven to be reliable in facilitating heat transfer for current chips. However, it is generally concluded that current methods of forced air cooling have reached their limits of performance. As such, the trend towards smaller, more powerful chips that generate even greater amounts of heat makes continued reliance on conventional air-cooled methods inadequate.

Thus, there is a need for a heat exchange apparatus that is capable of providing enhanced thermal transfer between a chip and a heat sink.

SUMMARY OF THE INVENTION

The present invention is a method and apparatus for cooling a semiconductor heat source. In one embodiment a thermal spreader is provided and includes a substrate for supporting the semiconductor heat source and a heat sink coupled to the substrate. A channel is disposed between the heat sink and substrate. The channel has at least one wall defined by the heat sink. The surface area of the channel wall defined by the heat sink is about 10 to about 100 times the surface area of a bottom surface of the semiconductor heat source. A coolant, for example liquid metal, recirculates within the channel.

In another embodiment, a method for cooling a semiconductor heat source is provided. The method includes providing a thermal spreader having a substrate for supporting the semiconductor heat source, a heat sink coupled to the substrate, and a channel disposed between the heat sink and substrate, the channel having at least one wall defined by the heat sink. A coolant is then flowed through the channel.

BRIEF DESCRIPTION OF THE DRAWINGS

So that the manner in which the above recited embodiments of the invention are attained and can be understood in detail, a more particular description of the invention, briefly summarized above, may be had by reference to the embodiments thereof which are illustrated in the appended drawings. It is to be noted, however, that the appended drawings illustrate only typical embodiments of this invention and are therefore not to be considered limiting of its scope, for the invention may admit to other equally effective embodiments.

To facilitate understanding, identical reference numerals have been used, where possible, to designate identical elements that are common to the figures.

DETAILED DESCRIPTION

Figure 1A:
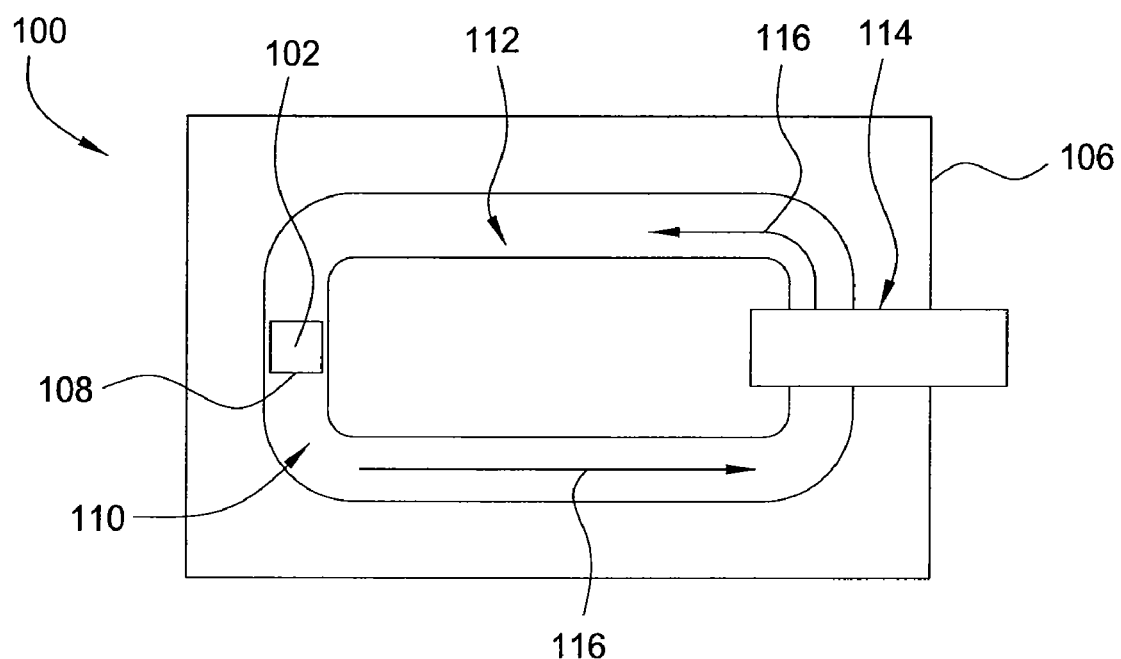
FIGS. 1A and 1B respectively depict top and side views of one embodiment of a thermal spreader according the present invention.
Figure 1B:
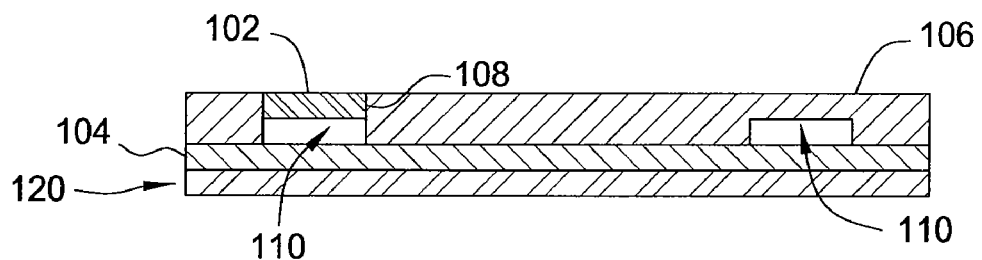

FIGS. 1A and 1B respectively depict top and side views of one embodiment of a thermal spreader 100. The thermal spreader 100 includes a substrate 106 coupled to a heat sink 104 and having a fluid flow channel 110 defined therebetween for circulating a coolant 112. The substrate 106 may comprise a thermally conductive or non-conductive material, such as metal, plastic or ceramic. In one embodiment, the substrate 106 is plastic or ceramic.

The heat sink 104 is a thermally conductive material, such as a metal, disposed beneath the substrate 106. The heat sink 104 and the substrate 106 may be coupled together by adhesive or by mechanical joining, such as by screwing, bolting, clamping, and the like, in a manner suitable to prevent leakage of the coolant 112 from the channel 110. Optionally, a gasket (not shown) may be interposed between the substrate 106 and the heat sink 104. In one embodiment, the heat sink 104 comprises copper or aluminum.

Optionally, a coating (not shown) may be disposed on the heat sink 104. The coating may improve compatibility between the coolant 112 and the materials comprising the heat sink 104. The coating may also be selected to enhance the adhesion of subsequent layers, to act as an oxidation prevention layer, or to enhance the wettability of the coolant 112 with respect to the surface of the heat sink 104. It is contemplated that multiple coatings may be provided. For example, a first coating may protect the heat sink 104 from the coolant 112, and a second coating may enhance the wettability of the coolant 112 over the surface of the heat sink 104.

The coatings may be applied by any conventional means, such as by evaporation, sputtering, plating, chemical vapor deposition, and the like. The thickness of the coating or coatings is chosen for robustness in the presence of the coolant 112 and generally will depend upon the material comprising the coating, the method of application, and the coverage required to achieve the intended purpose of the coating. In one embodiment, where the coolant 112 comprises a liquid metal, the coating may comprise at least one of chromium, gold, molybdenum, nickel, platinum, tantalum, titanium, and tungsten. In one embodiment, a chromium coating is disposed on the heat sink 104 and has a coating of either gold or platinum disposed on top of the chromium. The chromium coating may be formed to a thickness of about 2500 angstroms. The gold or platinum coating may be formed to a thickness of about 300 angstroms. Optionally, a coating of titanium, for example 500 angstroms thick, may be formed on the heat sink 104 in place of or on top of the layer of chromium.

The channel 110 is disposed between the heat sink 104 and the substrate 106. The channel 110 may be formed in the heat sink 104, the substrate 106, or in a combination thereof such that the heat sink 104 forms at least one wall of the channel 110. In the embodiment depicted in FIGS. 1A and 1B, the channel 110 is formed in the substrate 106 and the upper surface of the heat sink 104 forms the lower wall of the channel 110. The channel 110 typically exposes a surface area of the heat sink 104 that is about 10 to about 100 times the surface area of a heat source 102 that is to be cooled.

The coolant 112 generally fills the channel 110. In one embodiment the coolant is a liquid metal. Liquid metals have a high thermal conductivity that allows for efficient thermal coupling to the heat source 102. For example, the coolant 112 may comprise at least one of: gallium, indium, tin, bismuth, sodium, and potassium such that the coolant 112 is liquid over the desired range of operating temperatures of the thermal spreader 100. In another embodiment, the coolant 112 comprises a gallium indium tin alloy, for example, a gallium indium tin eutectic.

A pump 114, circulates the coolant 112 in the channel 110 as indicated by arrows 116. The pump 114 may be any conventional pump that is compatible with the coolant 112 and is capable of provided a desired flow rate of the coolant 112. In one embodiment, the pump 114 comprises a diaphragm pump, an impeller pump, or a positive displacement pump. In another embodiment, the pump 114 comprises a magnetohydrodynamic pump. The required flow rate of the coolant 112 in the channel 110 may be determined by the heat capacity and conductivity of the coolant 112 and the amount of heat desired to be removed per unit time.

The circulating coolant 112 spreads the heat from the heat source 102 over the greater surface area of the heat sink 104, thereby allowing for an increased rate of heat removal from the heat source 102. Optionally, one or more raised features may be formed on or coupled to the heat sink 104 within the channel 110 on order to increase the surface area of the heat sink 104 exposed to the coolant 112 flowing in the channel 110. For example, a plurality of fins (not shown) may be coupled to the heat sink 104 within the channel 110.

Figure 5:
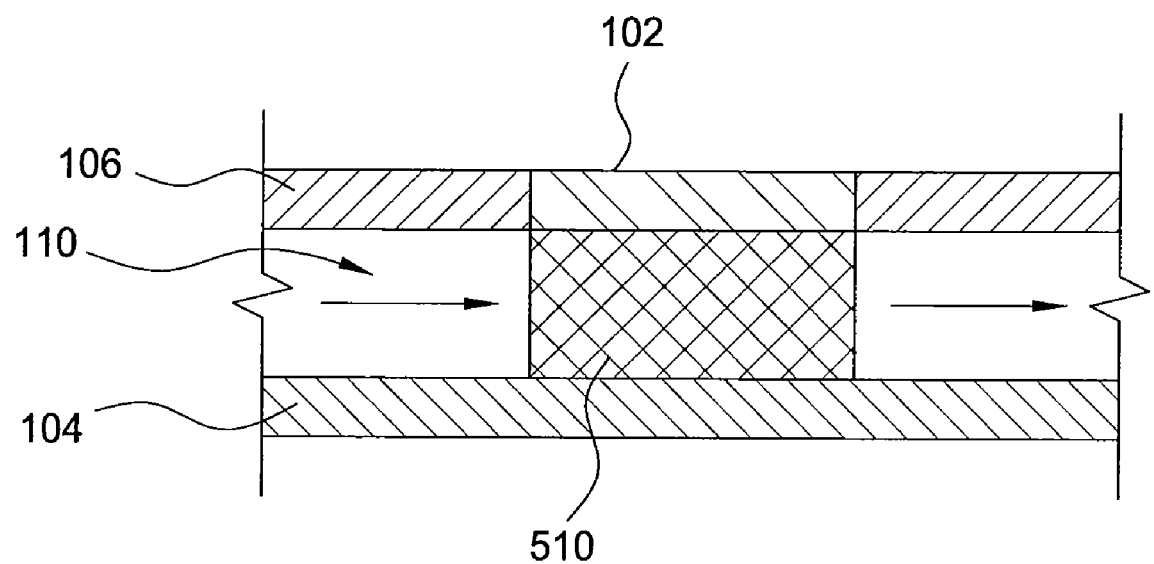
FIG. 5 illustrates a side view of another embodiment of a thermal spreader according to the present invention.

Optionally, a structure may be placed within the channel 110 in order to turbulently mix the coolant 112 flowing therein. For example, FIG. 5 depicts a mesh plug 510 disposed in the channel 110. The mesh plug 510 is generally sized to remain in contact with both the heat sink 104 and the heat source 102 (or the substrate 106 in embodiments where the heat source 102 is disposed above the substrate 106). The mesh plug 510 generally comprises a porous structure that allows the coolant 112 to readily flow through the mesh plug 510. The structure of the mesh plug 510 disrupts the laminar flow of the coolant 112 within the channel 110 and along the boundary layer of the channel 110, thereby causing turbulent mixing of the coolant 112 and enhancing the rate of heat transfer from the heat source 102 to the coolant 112. As such, the mesh plug 510 is generally disposed at least in the region proximate the heat source 102 and is generally at least as long as the portion of the heat source 102. However, increased heat transfer rates may be obtained utilizing a mesh plug 510 of any length, including lengths longer or shorter than the heat source 102.

As used herein, the term "mesh" refers to the structural arrangement of the material comprising the mesh plug 510 and includes woven and non-woven webs or screens, porous or sponge-like solids, a matrix of filaments, strands, fibers, or particles, or any other material form that provides a stable, mechanically compliant structure and has sufficient porosity for the coolant 112 to flow through the mesh plug 510. The size of the structures used in the mesh, and the resultant voids, or channels therethrough, are chosen to allow good fluid flow while providing high turbulence while taking account of the fluid viscosity and desired flow rate for a given heat load. A typical volume fraction for the mesh plug 510 will range from about 15 percent to about 45 percent in the active region of the device (i.e., in the region where the mesh plug 510 is employed). However, it is contemplated that other volume fractions may be utilized dependent upon the application, i.e., the material of the coolant 112 and the heat transfer requirements.

The mesh plug 510 may be made of metal or organic materials compatible with the coolant 112, e.g., the mesh plug 510 may be inert with respect to the coolant 112 or reactive with the coolant 112 in a manner that does not substantially degrade the structural or thermal properties of the components of the thermal spreader 100 or otherwise harm the heat source 102. Alternatively, the mesh plug 510 may comprise a material incompatible with the coolant 112, in which case the mesh plug 510 may further comprise a coating that is compatible with the coolant 112, as described below.

The mesh plug 510 may have a thermal conductivity greater than, equal to, or less than the thermal conductivity of the coolant 112. In one embodiment, the mesh plug 510 comprises at least one of copper, chromium, tungsten, tantalum, or titanium wire. Alternatively or in combination, the mesh plug 510 may comprise carbon fiber or fiberglass. Typical wire or fiber diameters may be from about 50 to about 100 microns. In one embodiment, the mesh plug 510 comprises a metal wire mesh plug. In one embodiment, the mesh plug 510 comprises a copper mesh plug or a tungsten mesh plug. In another embodiment, the mesh plug 510 may comprise glass wool or a glass mesh plug. Other suitable materials include copper wool, carbon fiber cloth, carbon fiber wool, porous graphite, machined graphite, electroformed nickel, and the like.

The mesh plug 510 may further comprise an optional coating (not shown). The optional coating protects the mesh plug 510 from any incompatibility with the coolant 112. For example, in one embodiment, the metal mesh plug 510 may comprise copper with a chromium, molybdenum, nickel, titanium, tantalum, or tungsten coating that protects the copper from a coolant 112 comprising a gallium indium tin alloy. It is contemplated that the coating may be formed over a mesh plug 510 that is compatible with the coolant 112. It is further contemplated that multiple coatings may be disposed over the mesh plug 510.

In embodiments where the mesh plug 510 is thermally conductive, the contact between the mesh plug 510 and the heat source 102 (or substrate 106) and the heat sink 104 further enhances heat transfer via continuous thermally conductive paths through the mesh plug 510. Optionally, in embodiments where the mesh plug 510 comprises a metal, the elements of the mesh plug 510 may be bonded together, for example by soldering, to further increase the thermal conductivity of the mesh plug 510. The mesh plug 510 may also optionally be soldered to the heat source 102, substrate 106, and/or the heat sink 104.

Returning to FIGS. 1A and 1B, a semiconductor heat source 102 is thermally coupled to the substrate 106 above the channel 110. In operation, the circulating coolant 112 absorbs heat from the heat source 102 and transfers it to the heat sink 104. The increased surface area of the heat sink 104 relative to the heat source 102 allows for more rapid removal of heat from the heat source 102. The semiconductor heat source 102 is defined herein as an integrated circuit (IC) chip, a portion of a chip, a plurality or array of chips, a circuit board or portion thereof, any material that is heated through the operation of a semiconductor device or devices, any combination of the preceding, and the like.

In the embodiment depicted in FIGS. 1A and 1B, an aperture 108 is formed in the substrate 106 and has a corresponding size and shape to fit the semiconductor heat source 102 at least partially therein, such that a bottom surface of the heat source 102 forms a portion of the wall of the channel 110 and is thereby in direct contact with the coolant 1 12. The heat source 102 may be secured in the aperture 108 by any conventional means. For example, the heat source 103 may be secured to within the aperture 108 by an epoxy.

Figure 4:
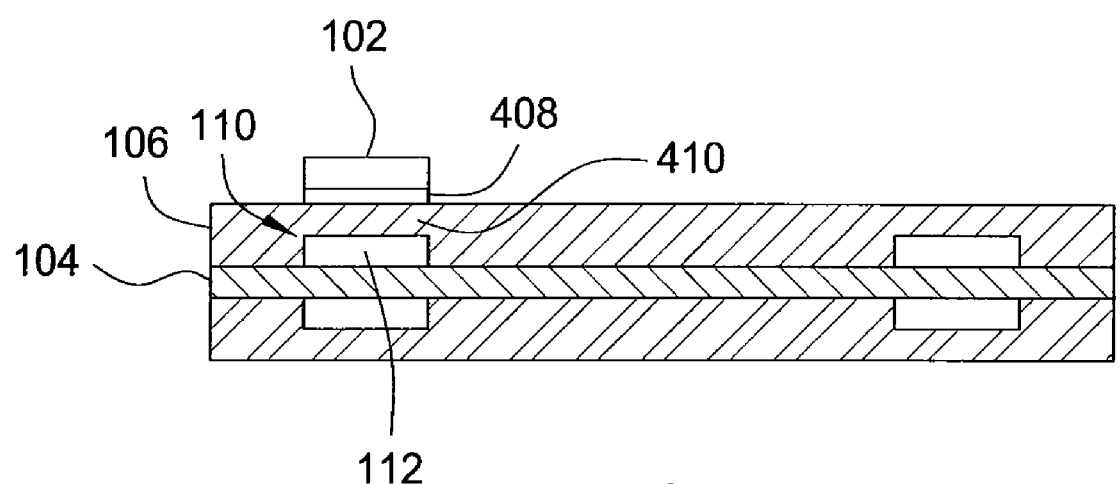
FIG. 4 illustrates a side view of another embodiment of a thermal spreader according to the present invention.

Alternatively, and as depicted in FIG. 4, the heat source 102 may be disposed on top of the substrate 106 and above the channel 110. A thermal interface 408 may be provided to enhance the thermal conductivity between the heat source 102 and the coolant 112 flowing in the channel 110. The thermal interface 408 may comprise a thermal paste, solder, bonded, or a liquid metal interface. The thermal interface 408 may also comprise a heterogeneous thermal interface having multiple components, for example liquid metal and filaments or particles of a compatible material. In embodiments where the heat source 102 is disposed above the substrate 106, at least a portion 410 of the substrate 106 disposed beneath the heat source 102 may comprise metal or other thermally conductive material to further enhance the rate of heat transfer from the heat source 102 to the coolant 112 flowing in the channel 110.

Returning to FIGS. 1A and 1B, a secondary cooler, or cooling device 120, is disposed beneath the heat sink 104. The cooling device 120 removes heat from the heat sink 104 to prevent the temperature of the heat sink 104 from rising to a level that impedes the efficient transfer of heat from the heat source 102 to the heat sink 104. The cooling device 120 may be any heat exchanging device with sufficient heat removal capacity to maintain the temperature of the heat sink 104 in a desired range during operation.

Figure 2A:
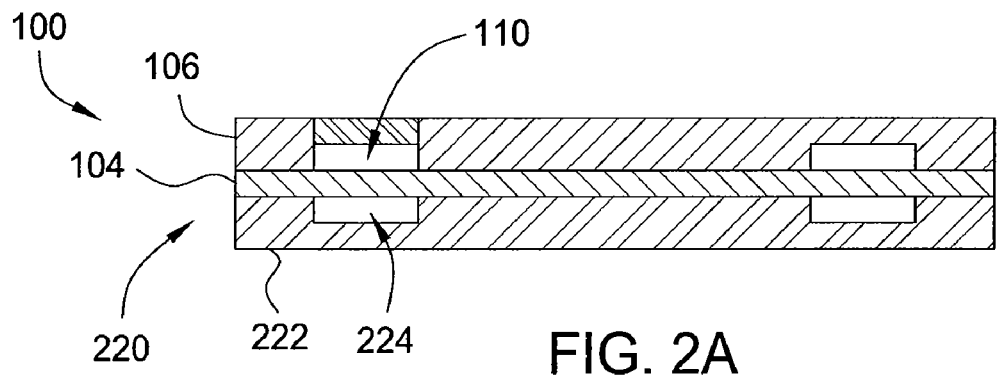
FIGS. 2A and 2B respectively illustrate a side and top view of one embodiment of a secondary cooler of the thermal spreader of FIG. 1.
Figure 2B:
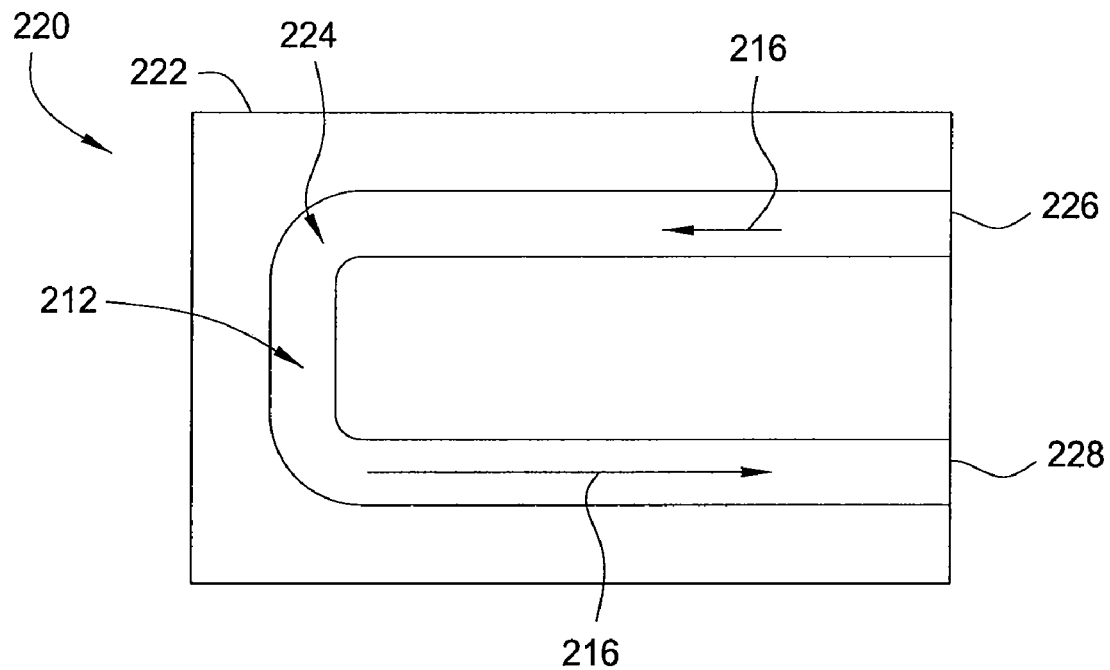

In the embodiment depicted in FIGS. 2A and 2B, a substrate 222 is coupled to the heat sink 104 on a side opposite the substrate 106 and defines a channel 224 therebetween. The channel 224 may be formed in the heat sink 104, the substrate 222, or in a combination thereof such that the heat sink 104 forms at least one wall of the channel 224. In the embodiment depicted in FIGS. 2A and 2B, the channel 224 is formed in the substrate 222 and the lower surface of the heat sink 104 forms the upper wall of the channel 224. Although the channel 224 is shown disposed opposite the channel 110, the channel 224 may be disposed along any portion of the heat sink 104 and in any desired geometry. A coolant 212 is disposed within the channel 224. The coolant 212 may be any heat transfer fluid, such as water, water-based liquids, alcohols, glycols, ethylene glycol, sodium chloride, oils, DYNALENE®, liquid metals, and the like. In one embodiment, the coolant 212 comprises water.

A pump (not shown) circulates the coolant 212 through the channel 224 as indicated by arrows 216. At least one inlet 226 and at least one outlet 228 are provided to allow the introduction and evacuation of the coolant 212 through the channel 224. Although a single channel 224 is shown in the embodiment depicted in FIGS. 2A and 2B, it is contemplated that multiple channels may be provided in any geometry as desired to maintain a level of performance of the thermal spreader 100. For example, in one embodiment, the channel 224, or multiple channels, may be configured to form a water jacket that surrounds the channel 110. The heat absorbed by the coolant 212 is removed using any conventional means, such as a radiator.

Figure 3:
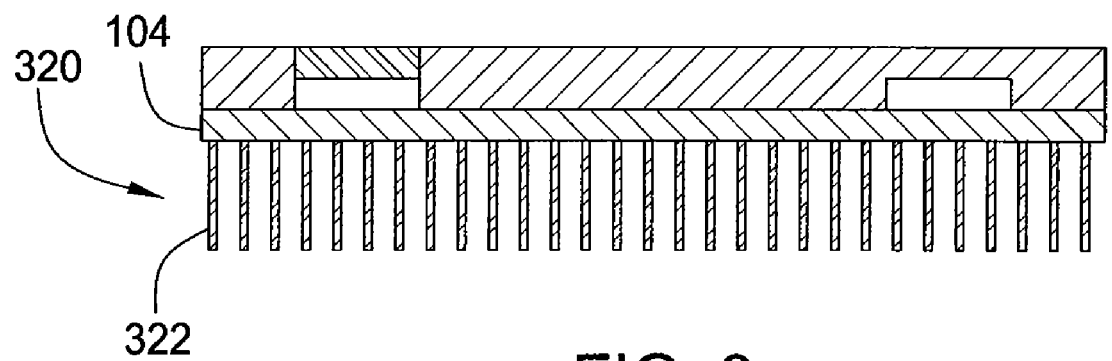
FIG. 3 illustrates a side view of another embodiment of a secondary cooler of the thermal spreader of FIG. 1.

FIG. 3 depicts another embodiment of a cooling device 320. In FIG. 3, a plurality of fins 322 are coupled to the bottom surface of the heat sink 104. The plurality of fins 322 comprise a thermally conductive material, such as a metal. The fins may be cooled by natural or forced-air convection. In one embodiment, the heat sink 104 and the plurality of fins 322 may be fabricated from a single material, such as by casting or machining. Alternatively, the plurality of fins 322 may be fabricated on a separate support plate (not shown) that is coupled to the heat sink 104 using conventional means such as adhesives, bonding agents, solder, rivets, screws, bolts, clamps, and the like. The plurality of fins effectively substantially increases the surface area of the heat sink 104, thereby allowing air convection to remove greater quantities of heat from the heat sink 104, as compared to air flowing over a smaller surface area of the heat sink 104.

Thus, a thermal spreader is disclosed that facilitates improved heat transfer away from a heat source, such as an IC chip, thereby allowing the IC device to operate more reliably and efficiently than IC chips cooled by conventional methods. It should be noted that the orientation of the apparatus in the drawings and any positional terms such as above and below are illustrative terms to show the relative configuration of components in the apparatus and are not limiting of scope. For example, the apparatus could be inverted or rotated at any angle with respect to the embodiments depicted herein. While the foregoing is directed to particular embodiments of the present invention, other and further embodiments of the invention may be devised without departing from the basic scope thereof, and the scope thereof is determined by the claims that follow.

The invention claimed is:

1. A thermal spreader for cooling a semiconductor heat source, comprising:
    a substrate for supporting the semiconductor heat source;
    a heat sink coupled to the substrate;
    a channel disposed between the heat sink and substrate, the channel having at least one wall defined by the heat sink;
    a coolant circulating through the channel, wherein the coolant is a liquid metal; and
    a thermal interface disposed between the semiconductor heat source and the substrate, the thermal interface comprising at least one of: a thermally conductive paste or a liquid metal thermal interface.

2. The thermal spreader of claim 1, wherein the coolant comprises at least one of: gallium, indium, tin, bismuth, sodium or potassium.

3. The thermal spreader of claim 1, wherein the coolant comprises a gallium indium tin alloy.

4. The thermal spreader of claim 1, further comprising:
    a pump coupled to the channel for pumping a coolant therethrough.

5. The thermal spreader of claim 4, wherein the pump is one of a diaphragm pump, an impeller pump, or a positive displacement pump.

6. The thermal spreader of claim 4, wherein the pump is a magneto-hydrodynamic pump.

7. The thermal spreader of claim 1, further comprising:
a secondary cooling device coupled to the heat sink.

8. The thermal interface of claim 7, further comprising:
a plurality of fins coupled to the heat sink.

9. The thermal interface of claim 1, further comprising:
a mesh disposed in the channel for turbulently mixing the coolant.

10. The thermal spreader of claim 1, wherein the surface area of the at least one wall defined by the heat sink is about 10 to about 100 times a surface area of a bottom surface of the semiconductor heat source.

11. The thermal spreader of claim 1, wherein the substrate comprises at least one of: plastic or ceramic.

12. The thermal spreader of claim 1, wherein the heat sink comprises a metal.

13. The thermal spreader of claim 1, wherein the heat sink comprises at least one of: copper or aluminum.

14. The thermal spreader of claim 1, further comprising:
a coating disposed on the heat sink.

15. The thermal spreader of claim 14, wherein the coating comprises at least one of: chromium, gold, molybdenum, nickel, platinum, tantalum, titanium, or tungsten.

16. The thermal spreader of claim 1, further comprising:
an aperture formed in the substrate and having a size and shape for receiving at least a portion of the semiconductor heat source, such that at least a portion of a bottom surface of the semiconductor heat source defines a wall of the channel and is exposed to the coolant when inserted into the aperture.

17. The thermal spreader of claim 1, further comprising:
a second substrate coupled to the heat sink on an opposite side of the heat sink from the substrate that supports that semiconductor heat source; and
a second channel disposed between the heat sink and the second substrate, the second channel having at least one wall defined by the heat sink.

18. A method of cooling a semiconductor heat source, comprising:
providing a thermal spreader having a substrate for supporting the semiconductor heat source, a heat sink coupled to the substrate, and a channel disposed between the heat sink and substrate, the channel having at least one wall defined by the heat sink;
flowing a coolant through the channel, wherein the coolant is a liquid metal; and
providing a thermal interface between the semiconductor heat source and the substrate, the thermal interface comprising at least one of: a thermally conductive paste or a liquid metal thermal interface.

19. The method of claim 18, further comprising:
circulating the coolant through the channel using a magneto hydrodynamic pump.

20. The method of claim 18, further comprising:
providing an aperture formed through the substrate for receiving at least a portion of the semiconductor heat source therein; and
positioning the at least a portion of the semiconductor heat source in the aperture, such that the at least a portion of the semiconductor heat source defines a wall of the channel and is exposed directly to the coolant.

21. The method of claim 18, further comprising:
circulating the coolant through the channel using a pump.

22. The method of claim 18, further comprising:
providing a second substrate coupled to the heat sink on an opposite side of the heat sink from the substrate that supports that semiconductor heat source; and
providing a second channel disposed between the heat sink and the second substrate, the second channel having at least one wall defined by the heat sink.

* * * * *